United States Patent [19]
Venkatasubramanian

[11] Patent Number: 6,071,351
[45] Date of Patent: Jun. 6, 2000

[54] LOW TEMPERATURE CHEMICAL VAPOR DEPOSITION AND ETCHING APPARATUS AND METHOD

[75] Inventor: Rama Venkatasubramanian, Cary, N.C.

[73] Assignee: Research Triangle Institute, Research Triangle Park, N.C.

[21] Appl. No.: 09/147,199

[22] PCT Filed: May 2, 1997

[86] PCT No.: PCT/US97/07391

§ 371 Date: May 7, 1999

§ 102(e) Date: May 7, 1999

[87] PCT Pub. No.: WO97/41276

PCT Pub. Date: Nov. 6, 1997

Related U.S. Application Data

[60] Provisional application No. 60/016,701, May 2, 1996.

[51] Int. Cl.[7] ............................ C23C 16/00; C23C 16/24; C23C 16/30; C30B 23/00
[52] U.S. Cl. .................. 118/725; 427/248.1; 427/255.2; 427/588; 427/590; 117/200
[58] Field of Search .......................... 118/725; 427/255.2; 427/588, 590, 248.1; 117/200

[56] References Cited

U.S. PATENT DOCUMENTS

| | | |
|---|---|---|
| 4,780,174 | 10/1988 | Lan et al. . |
| 5,060,354 | 10/1991 | Chizinsky . |
| 5,077,875 | 1/1992 | Hoke et al. . |
| 5,407,486 | 4/1995 | Ono . |
| 5,651,827 | 7/1997 | Aoyama et al. ........................ 118/725 |
| 5,938,850 | 8/1999 | Arami et al. ............................ 118/715 |
| 5,951,774 | 9/1999 | Shishiguchi et al. ................... 118/725 |
| 5,970,213 | 10/1999 | Cord et al. ............................. 392/416 |

FOREIGN PATENT DOCUMENTS 4-83333  3/1992  Japan .

OTHER PUBLICATIONS

Stringfellow, Vapor Phase Growth, Crystal Growth, 1980, p. 192.

*Primary Examiner*—Jeffrie R Lund
*Attorney, Agent, or Firm*—Oblon, Spivak, McClelland, Maier & Neustadt, P.C.

[57] ABSTRACT

An apparatus and method for the growth and etching of materials where a substrate on which a film is being deposited or which is being etched is maintained at a lower temperature than a precursor cracking temperature. The apparatus includes a susceptor with separators, made of an optically transmissive material with low thermal conductivity, such as quartz, upon which the substrates are mounted. The susceptor is heated to a precursor cracking temperature while the substrates are maintained at a lower deposition temperature by the separators. The substrates are heated by black body radiation transmitted through the separators to the substrates.

50 Claims, 7 Drawing Sheets

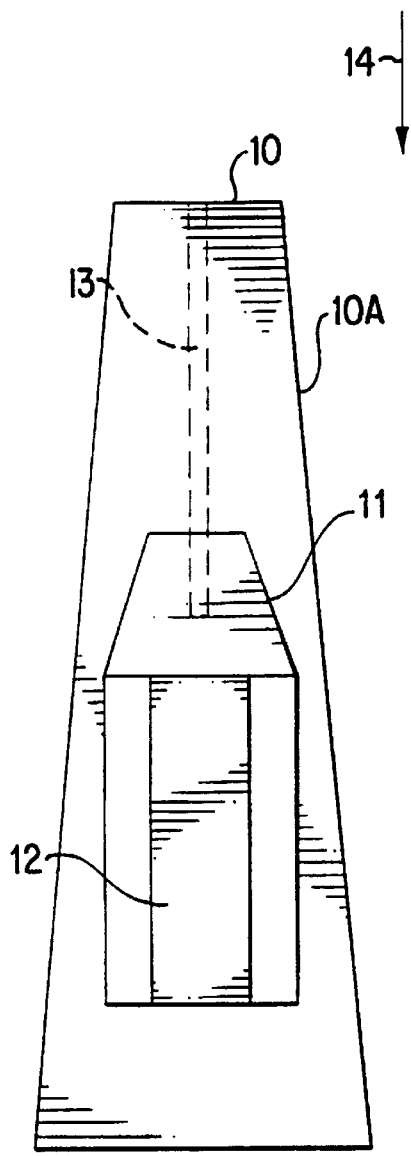
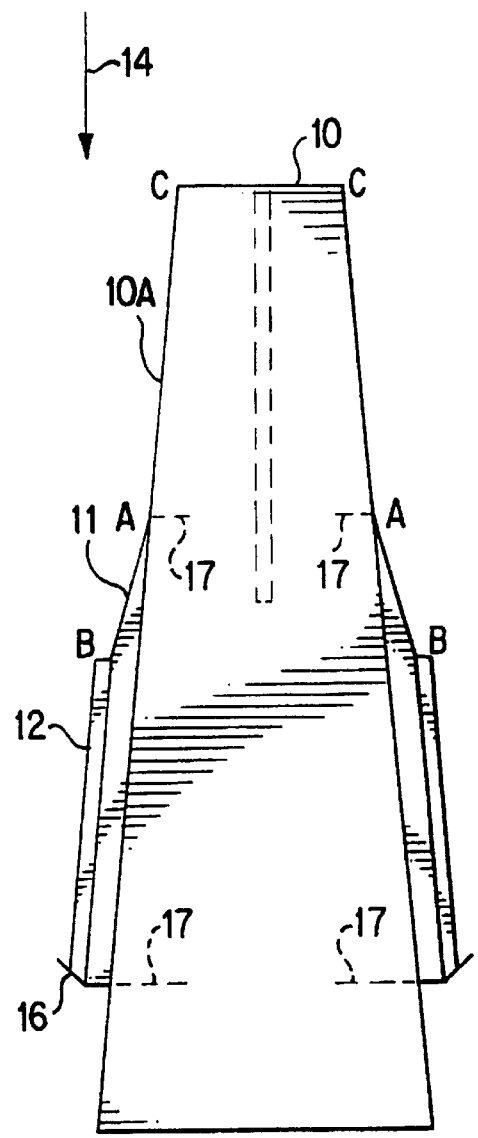
FIG. 1A
FIG. 1B 3.0 μm  3.0 μm

LOW TEMPERATURE CHEMICAL VAPOR DEPOSITION AND ETCHING APPARATUS AND METHOD

This application is a 371 of PCT/US97/07391 filed May 2, 1997 and claims benefit of Provisional application Ser. No. 60/016,701 filed May 2, 1996.

BACKGROUND OF THE INVENTION

1. Field of the Invention

The present invention relates to an apparatus and method for achieving low growth temperature in chemical vapor deposition (CVD) and low temperature etching, and in particular to a metallorganic chemical vapor deposition (MOCVD) method that achieves low growth temperature while simultaneously allowing high-temperature cracking of growth precursors and etching at reduced substrate temperatures. The present invention is applicable to the low-temperature deposition of a variety of materials, enhancing the pyrolysis-efficiency of source gases/chemicals in chemical vapor deposition (CVD) systems, obtaining two-dimensional layered growth of many materials, as well as etching of a variety of materials.

2. Discussion of the Background

Deposition of many materials by MOCVD, also known as organometallic vapor phase epitaxy (OMVPE), is well documented. In all the previously described MOCVD growth approaches, a substrate, on which the deposition of material/materials is achieved, is kept directly on an RF-heated susceptor or on a resistively-heated susceptor. In some cases, the substrate is heated by infra-red radiation. In a typical MOCVD growth apparatus, organometallic sources and other gaseous sources tend to thermally disassociate in the vicinity of the hot susceptor, adsorb on to the substrate-surface, react and form a growing layer that is desired/intended.

For many applications, such as (1) in obtaining growth of materials which are stable only at lower temperatures, below the cracking temperature of the growth-precursors that produce the material, (2) in obtaining improved material quality by avoiding exposure of the substrate (and the growing film) to higher temperatures, (3) in obtaining improved device structures by avoiding inter-diffusion between the various deposited layers, etc., it is desirable to maintain the substrate at lower temperatures during the deposition process. This has been traditionally achieved through judicious choice of organometallic and hydride precursors, in MOCVD, which crack at lower growth temperatures so that the substrate can be maintained at lower temperatures, through mechanisms like photo-induced dissociation of precursors or through heated pre-cracking of source gases. However, while many of these approaches have had some success, many also have limitations.

For example, in the ultraviolet-photon-induced dissociation of organometallic sources in the growth of HgCdTe, unwanted homogeneous nucleation can occur leading to particulate formation in the gas-phase and therefore, poor quality epitaxial growth of HgCdTe on the substrate. Similarly pre-cracked $AsH_3$ to produce As for GaAs growth at lower temperatures, leads to undesirable, extremely high levels of C in GaAs. Similarly, use of exotic precursors (if they can be synthesized and made stable for handling, transportation, and storage) to achieve lower growth temperatures can lead to an expensive epitaxial deposition process.

SUMMARY OF THE INVENTION

It is an object of the present invention to reduce the temperature at which a substrate is maintained during a deposition or etching process while maintaining a higher thermal cracking temperature.

Another object of the invention is to maintain the higher thermal cracking temperature in the vicinity of the lower-temperature substrate.

A further object of the invention is to improve the efficiency of the cracking process for precursors.

A still further object of the invention is to avoid or minimize gas-phase homogeneous reactions.

Still another object of the invention is to controllably heat a substrate through optical coupling of black body radiation emitted from a susceptor to a temperature lower than that of the susceptor.

These and other objects of the invention are achieved by an apparatus having a susceptor with separators mounted on the susceptor upon which substrates are placed. When the susceptor is heated, typically to a processing temperature, the substrates are controllably heated through the separators to a temperature lower than the processing temperature.

In one embodiment, a susceptor is made from graphite and the separators are optically transmissive and of low thermal conductance, preferably being made from quartz. The susceptor is heated using, for example RF energy or resistive heating, and the substrates are heated by optical coupling of black body radiation emitted from the susceptor. The substrates are maintained at a temperature of approximately 100–200° C. lower than the susceptor temperature.

The objects of the invention are also achieved by a method where a growth or etching operation is performed in which the susceptor is heated to a processing temperature, such as a precursor cracking temperature, and the substrates are maintained at a lower temperature. The method is particular advantageous in forming materials that require the lower substrate temperature for high quality characteristics such as single-crystallinity, carrier mobility, incorporation of particular species or dopants, but require the higher processing temperature to crack precursors or produce desired growth or etchant species. Examples of such materials are single-crystal $Bi_2Te_3$ and $Sb_2Te_3$.

The present invention is applicable to the growth and etching a wide variety of materials. For example, the invention is particularly suited to grow materials that are thermally unstable at the higher processing temperature yet stable at the lower substrate temperatures. It is also suited for etching (or growth) of materials conventionally performed using plasma etching (or deposition) with cooled substrates, as the invention can avoid the damage to the materials from the plasma. The invention also offers better etch profiles by providing the control over both of the processing and substrate temperatures.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 1A and 1B are diagrams of a susceptor according to the invention;

DESCRIPTION OF THE PREFERRED EMBODIMENTS

Figure 2:
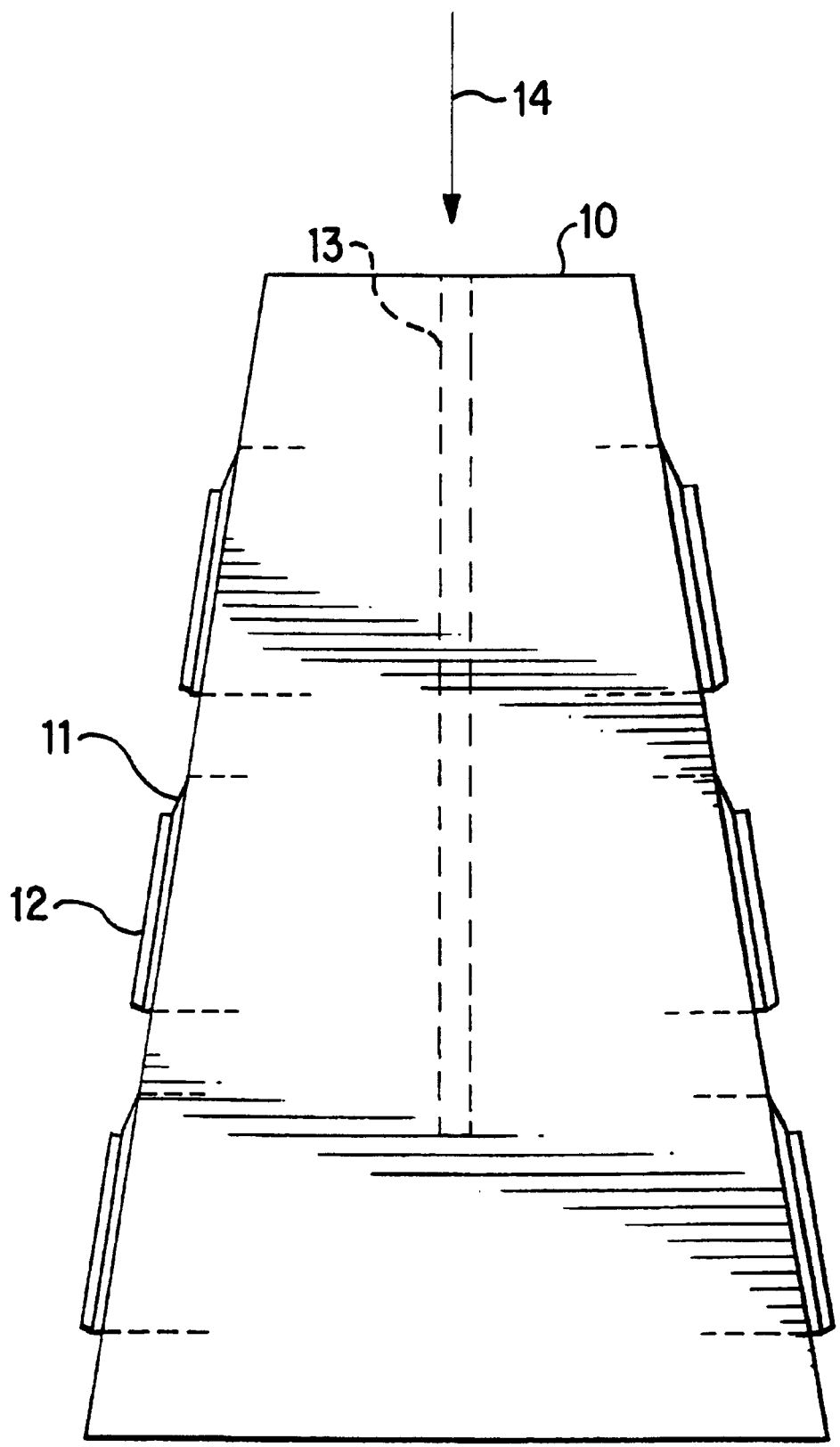
FIG. 2 is a diagram of a susceptor according to the invention.

Referring now to the drawings, where like reference numerals designate corresponding parts throughout the views, and more particularly to FIGS. 1A and 1B which illustrate two geometric views of the susceptor 10 according to the invention for application in low-temperature CVD or MOCVD growth or etching of materials. A typical susceptor is made of graphite with a SiC or BN coating. The susceptor 10 is heated using, for example, an RF-coil (not shown). The upper portion or front end 10A of susceptor 10 is used to crack gas precursors. A hole 13 for a thermocouple to monitor the temperature of susceptor 10 is provided. Mounted on the lower portion of susceptor 10 are quartz attachments 11, hereafter referred to as quartz-separators. Separators 11 are attached to susceptor 10 with pins 17, preferably made of quartz. Substrates 12 are positioned on separators 11 and rest on lip 16. Substrates 12, on which growth or etching is achieved, are thus not in direct contact with the heated susceptor, but instead, are on quartz separators 11.

While separator 11 and substrate 12 are shown as rectangular, other shapes can be used with the invention. That is, separator 11 can be of any desired shape to accommodate the substrate required for a particular application. The thickness of the separator can also vary depending upon deposition conditions, with typical thicknesses being in the range of 15–20 mils.

The quartz separator 11 is not coupled to the RF-coil, being an electrical insulator, and is not heated by eddy currents. Further, the well-known poor thermal conductivity of quartz plus its limited contact-area with heated susceptor 10, result in negligible conduction-heating of substrate 12 from heated susceptor 10. Instead, substrate 12 is heated from the black-body radiation of heated susceptor 10 that can be controllably transmitted, or optically coupled through separator 11. Thus, the substrates 12, on separators 11, are kept at a lower temperature than susceptor 10.

In laboratory experiments, the temperature of substrate has been found to be 100° to 200° C. below the temperature of the graphite-susceptor 10 for susceptor temperatures of 700° C.–800° C., depending on the geometry of the quartz-separator 11.

It is important to note in FIGS. 1A and 1B that while the substrate-temperature is effectively lowered from the graphite-susceptor temperature by about 100 to 200° C., the front-end or upper portion of the susceptor 10 (which is not covered by quartz-separator 11) will be at the temperature of the graphite-susceptor 10 and thus help to thermally crack the growth precursors (which flow in the direction shown by arrow 14), corresponding to the thermal efficiency obtainable at the temperature of the susceptor. Thus the susceptor-quartz separator combination allows the growth and etching of materials on substrate 12 at significantly lower temperatures, while still maintaining the front-end of heated susceptor 10 (from A to C, as shown in FIGS. 1A and 1B) at a desired temperature to crack the growth or etchant species.

As an example, if susceptor 10 is kept at a temperature of ~700° C., a cracking temperature of ~700° C. and a substrate temperature of 500° to 550° C. can be realized. This is clearly advantageous for achieving high precursor-utilization efficiency with low substrate temperatures. Such low substrate temperatures are also beneficial for a variety of material and device requirements as discussed below. As another example, materials at substrate temperatures of ~200° C. can be grown while precursor-cracking temperatures of ~400° C. are employed. It should be pointed out that the substrate temperature may be lowered by more than 150–200° C.

Separator 11 includes a ramp 15 (between positions A and B) which provides a smoother transition of gas flow to the substrate to optimize growth conditions. While not illustrated, separator 11 may also be recessed where the substrate is placed such that the point B is substantially coincident with the surface of substrate 12. The dimension of the segment AB, the thickness of the quartz-separator, the reflectivity of the quartz surface that is facing the heated susceptor, and the angle between the vertical axis and the plane of quartz plate, are parameters that can be optimized for a given set of growth-chemistry or etching considerations. For example, an increase in the reflectivity of the surface of separator 11 facing susceptor 10 will lower the substrate temperature by adjusting the transmission of the black body radiation. This may be accomplished by applying a reflective coating, such as a dielectric coating, preferably to the surface of separator 11 facing susceptor 10. The coating may also be applied to the outer surface of separator 11. Accordingly, the substrate temperature may be lowered less or more than the 100–200° mentioned above. For example, multiple wavelength dielectric coatings could be applied to achieve considerable reflection, resulting in a larger temperature reduction, such as 350° C.

Note that the gas flow, behind separator 11, is avoided by ramp 15. This will prevent growth or etchant species from accumulating and causing film growth or contamination behind separator 11 and thus altering the transmission characteristics of separator 11.

The susceptor-plus-separator approach is easily scalable to large-area deposition, one approach to which is shown schematically in FIG. 2. It should also be pointed out that the characteristics of the several separators 11 in FIG. 2 may be varied, allowing different substrate temperatures and corresponding different growth characteristics in a single susceptor. This approach is also applicable to all other MOCVD or CVD reactor configurations having various susceptor designs for the deposition (or etching) of a variety of materials.

The present invention offers higher in-situ precursor-cracking temperatures but lower substrate temperatures with a separator made of quartz. Quartz as a material offers very low thermal conductivity to minimize conduction heating of substrate (as mentioned above) and sufficient optical transparency that can be suitably optimized to achieve the necessary radiation heating of the substrate. The separator can be made of other materials which are poor thermal conductors yet optically transparent to achieve the same purpose.

In a second embodiment of the susceptor according to the invention, two susceptor temperature heating zones, in close proximity, one for in-situ high-temperature cracking of precursors and another for low-temperature substrate, can be constructed to achieve similar results, although it may add complexity to the system. The two zones could be thermally insulated in the case of a graphite susceptor to prevent heat from the hotter zone will transfer to the lower-temperature zone. The dual zone heating will allow greater control over the temperatures of the susceptor in the portion used for processing, such as cracking, and the portion used for growth and etching. A wider range of difference between the processing and substrate temperature may be possible.

The present invention is not limited to the disclosed embodiments, i.e. a singly-controlled susceptor heating and an optically-coupled heat transmission to the substrate, or a doubly-controlled substrate on which MOCVD or CVD growth is carried out but is directed generically to lowering the substrate temperature from a processing temperature for growth or etching of materials.

In a first embodiment of the method according to the invention, two-dimensional layered growth of materials is realized, by reducing higher surface-mobility (usually larger at higher substrate temperatures) of adsorbed-atoms, thereby preventing 3-dimensional, islanded growth, while still keeping the front-end of the susceptor at higher temperatures to crack the precursors (for example organometallic sources of Bi and Te for $Bi_2Te_3$ growth). The inventors have taken data on the growth of epitaxial layers on substrates, for example, sapphire and GaAs, to illustrate the advantages of the present invention. The data also illustrates that the susceptor according to the invention is necessary to deposit single-crystalline epitaxial layers such as, for example, $Bi_2Te_3$.

EXAMPLE 1

Figure 3A:
FIGS. 3A and 3B are diagrams of the surface topology of $Bi_2Te_3$ grown on a GaAs substrate placed directly on a susceptor and placed on a quartz-separator on a heated susceptor, respectively.
Figure 4A:
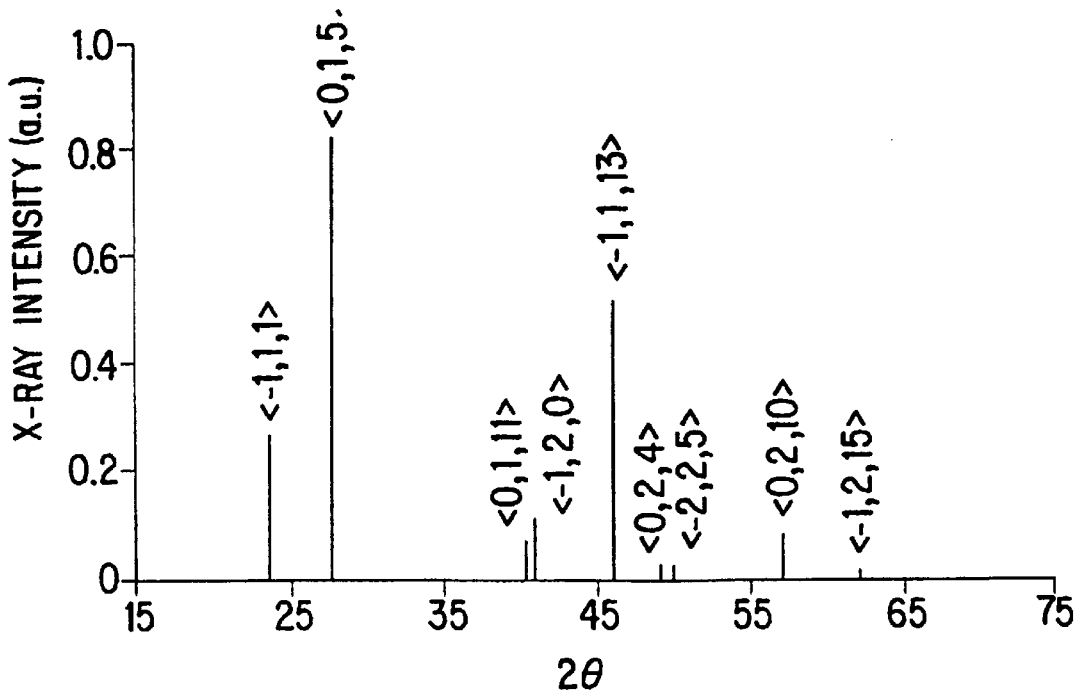
FIGS. 4A and 4B are x-ray diffraction data of the films shown in FIGS. 3A and 3B, respectively.

FIG. 3A shows the surface-topography of a $Bi_2Te_3$ film grown on a GaAs substrate directly contacting a graphite susceptor, using tri-methyl-bismuth and diisopropyltelluride (DIPTe) at a susceptor temperature of 350° C. DIPTe has appreciable thermal cracking efficiency only at temperatures near 300 to 350° C. In FIG. 3A, the $Bi_2Te_3$ film has islanded leading to larger polycrystallites. The polycrystalline nature of such a film is evident in the X-ray diffraction spectrum obtained on this film as well, as shown in FIG. 4A.

Figure 3B:
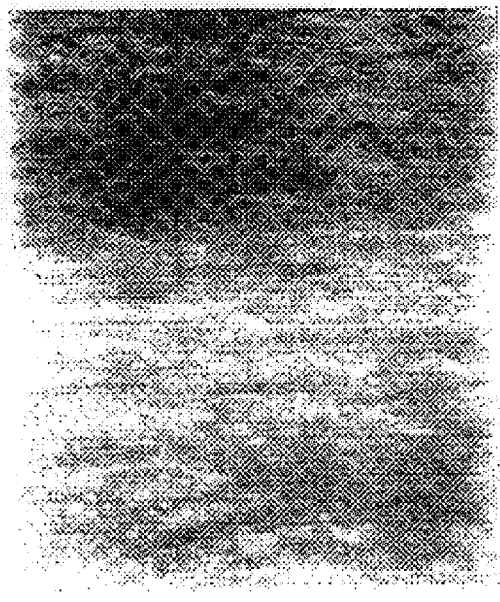
Figure 4B:
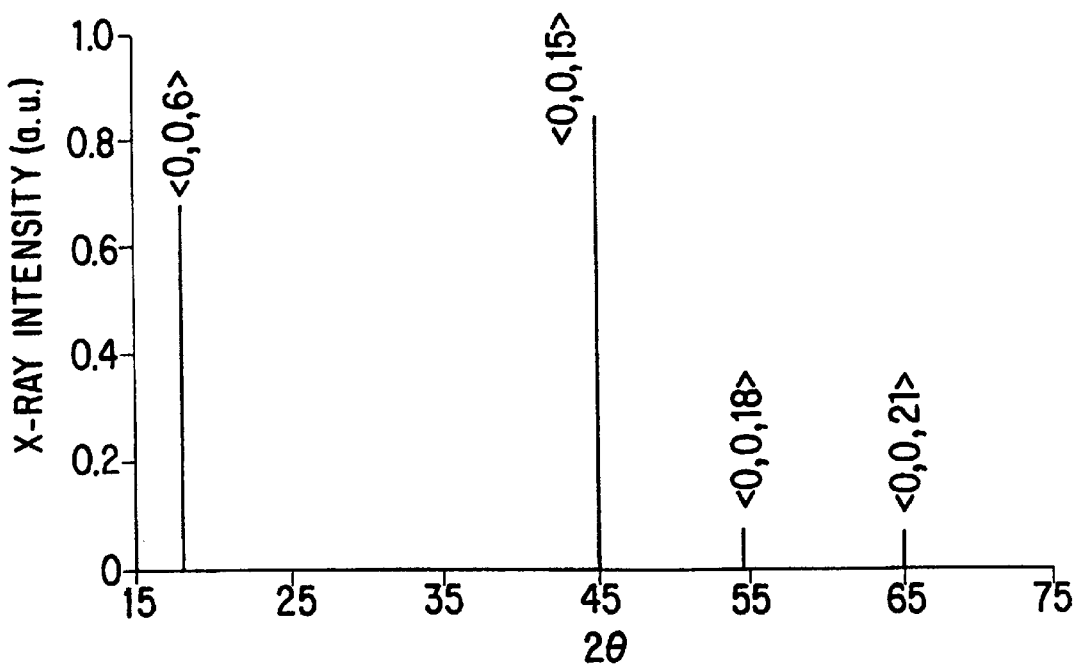

In contrast, FIG. 3B shows the surface-topography of a $Bi_2Te_3$ film grown on a GaAs substrate, placed on the quartz-separator as shown in FIG. 1, with a susceptor temperature of 350° C. and an estimated substrate temperature of 200° C. The $Bi_2Te_3$ film shown in FIG. 3B is smooth and two dimensional. The single-crystalline nature of the $Bi_2Te_3$ film in FIG. 3B, grown with the quartz-separator arrangement according to the invention was confirmed by X-ray diffraction scan (FIG. 4B). Only the (00 n, n=6, 15, 18, 21) X-ray reflections, of expected intensity based on structure-factor calculations, are evident, confirming the single-crystallinity of the film.

EXAMPLE 2

Figure 5A:
FIGS. 5A and 5B are diagrams of surface topology of $Sb_2Te_3$ grown on a GaAs substrate placed directly on a susceptor and placed on a quartz-separator on a heated susceptor, respectively.
Figure 5B:

The present invention is also advantageous for the growth of $Sb_2Te_3$ layers by MOCVD. In the case of direct growth of $Sb_2Te_3$ layers on a hot susceptor, the $Sb_2Te_3$ layer decomposes or islands at the temperatures at which the DIPTe precursor can crack to form the $Sb_2Te_3$ layer. Here, the susceptor was heated to 350° C., producing a substrate temperature of approximately 200° C. The comparative morphological data, with and without the quartz-separator arrangement, are shown in FIGS. 5A and 5B. The $Sb_2Te_3$ film shown in FIG. 5A was grown on a GaAs substrate placed directly on a susceptor heated to 350° C. and exhibits discontinuous, islanded growth. In contrast, the film shown in FIG. 5B exhibits smooth, two-dimensional single-crystalline growth. Note that a few stacking faults, typical in epitaxial films, are evident.

EXAMPLE 3

The present invention is also advantageous for the growth of layered (SL) superlattice structures, which may have a significant impact in the performance of thermoelectric materials. In this example a $Bi_2Te_3$-$Sb_2Te_3$ SL structure was formed. The films were grown under the conditions described above in Examples 1 and 2. The comparative cross-sectional data on the growth of SL structures, with and without the quartz-separator, are shown in FIGS. 6A and 6B.

Figures 6A, 6B:
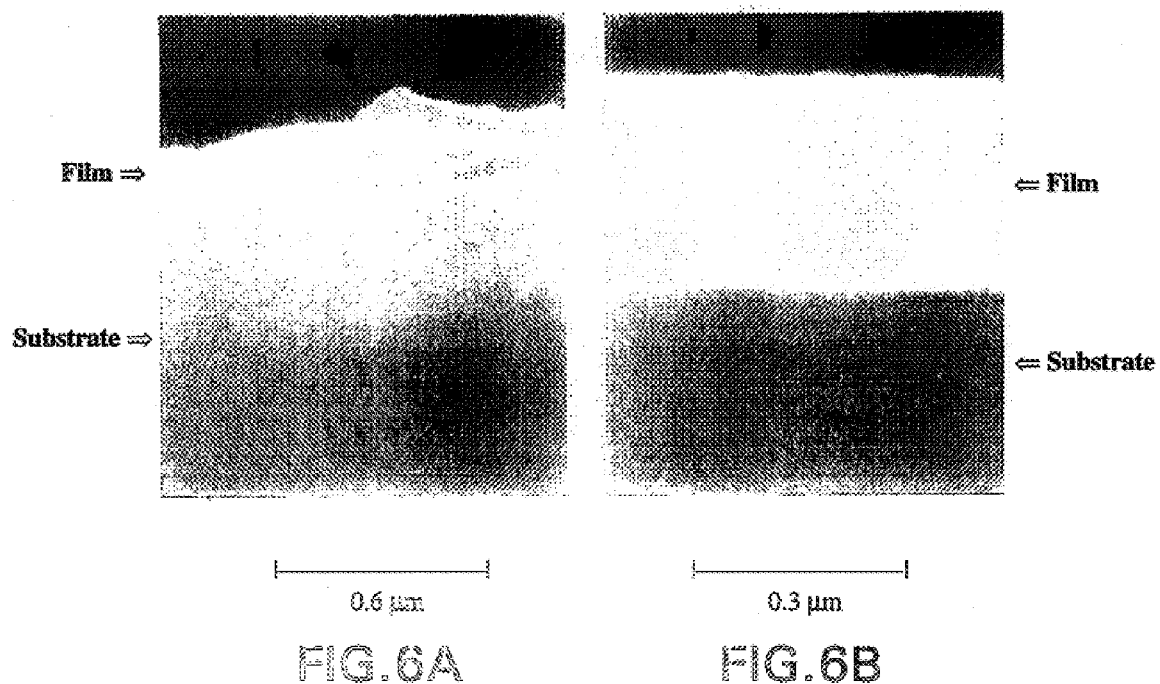
FIGS. 6A and 6B are diagrams of surface topology of a $Bi_2Te_3/Sb_2Te_3$ multilayer structure grown on a GaAs substrate placed directly on a susceptor and placed on a quartz-separator on a heated susceptor, respectively.

FIG. 6A is a SEM photograph of a cross-section of a $Bi_2Te_3$/$Sb_2Te_3$ multilayer structure grown directly on a susceptor, while FIG. 6B is a SEM photograph of a $Bi_2Te_3$/$Sb_2Te_3$ multilayer superlattice grown on a GaAs substrate disposed on a quartz separator on a susceptor. The individual $Bi_2Te_3$ and $Sb_2Te_3$ layers (60 Å each) of the superlattice cannot be resolved due to the lower magnification. The layers could be resolved by transmission electron microscopy.

Figure 7A:
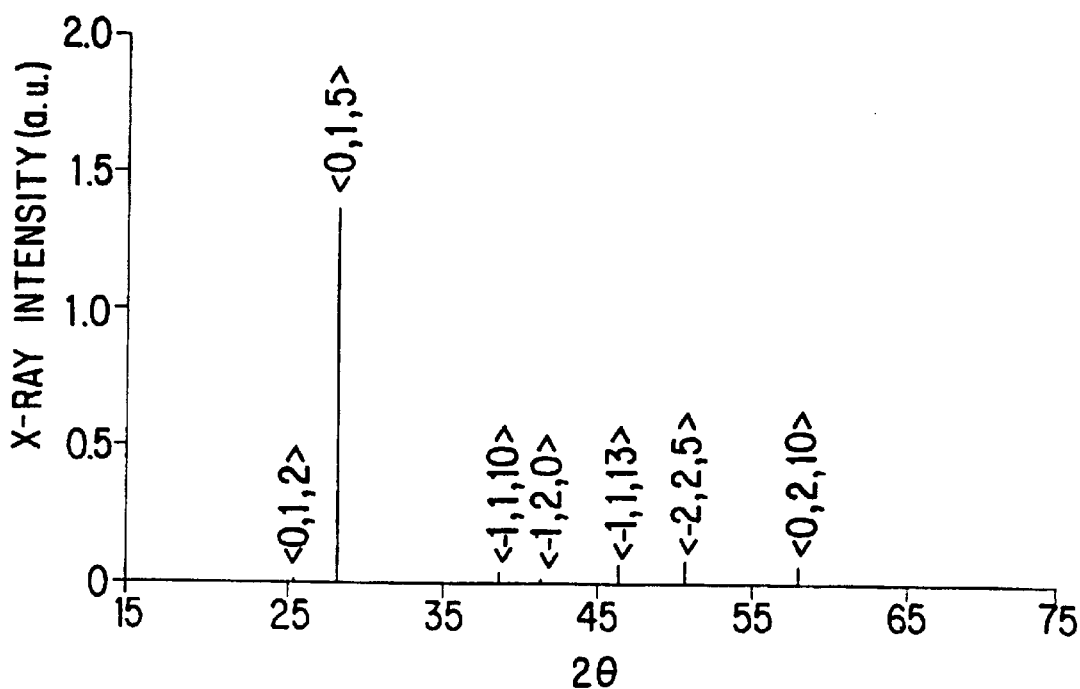
FIGS. 7A and 7B are diagrams x-ray diffraction data of the films shown in FIGS. 6A and 6B, respectively.
Figure 7B:
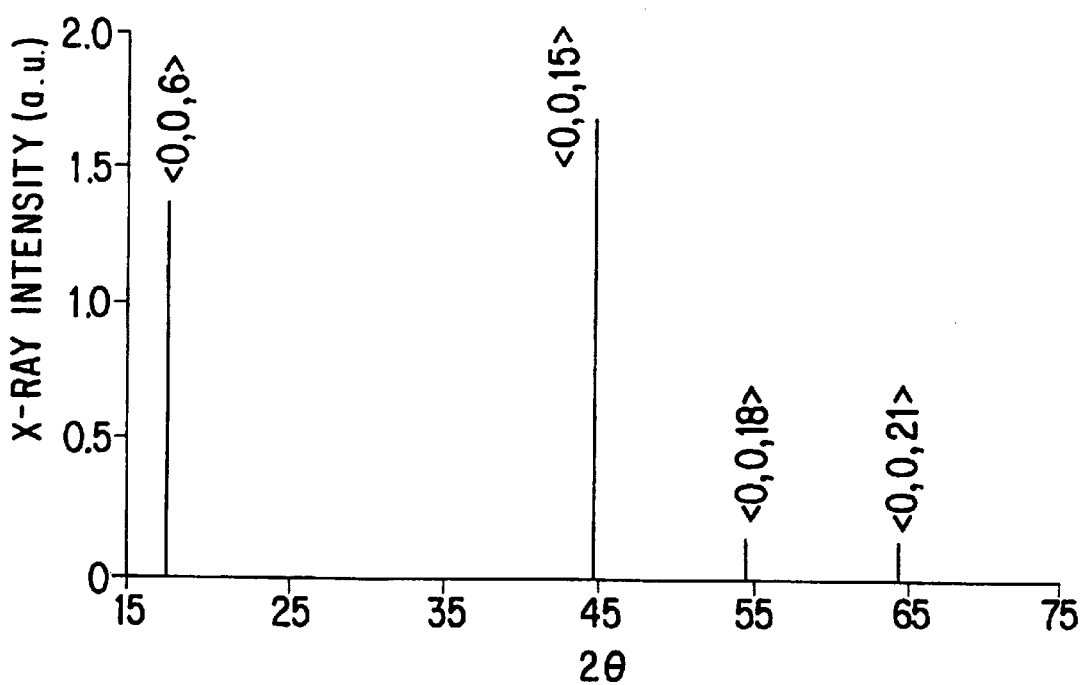

The X-ray data corresponding to sample in FIGS. 6A and 6B are shown in FIGS. 7A and 7B, once again indicating layered, two-dimensional, single crystalline growth being achieved with the apparatus and method according to the invention.

EXAMPLE 4

Another low-substrate temperature but high cracking-temperature application for the apparatus and method according to the invention is in the MOCVD growth of GaN. Typically, a high growth temperature (~900 to 1000° C.) is being used to grow GaN. One of the main reasons for the high growth temperature is to allow appreciable pyrolysis/cracking of the growth precursor, $NH_3$. This high growth temperature is expected to lead to high residual doping levels in the as-grown layers, especially from Si contamination from various sources. This is evidenced by the typically observed high n-type doping levels in undoped MOCVD-grown GaN layers. This high residual n-type doping levels can lead to compensation in p-type materials. The lack of high p-doping levels has been cited often as a cause for the poor performance of GaN-based light-emitting diodes and lasers. Using the susceptor-quartz separator combination indicated above and cracking of $NH_3$ at temperatures of ~950° C., we have obtained GaN growth at substrate temperatures of ~800° C.

EXAMPLE 5

The apparatus and method according to the invention can be beneficial to the low-temperature growth of GaN-based compounds (specifically $Ga_xIn_{(1-x)}N$ with x<0.85) by MOCVD. These $Ga_xIn_{(1-x)}N$ compounds have applications in light emitting diodes and laser devices. These compounds tend to be thermally unstable at typical temperatures where GaN growth is carried out, and so it would be desirable to reduce the substrate temperatures for the MOCVD of these materials. However, the poor pyrolysis of $NH_3$ at these reduced temperatures lead to extremely low growth rates. The apparatus and method according to the invention offers simultaneously the benefits of high-temperature cracking of $NH_3$ and low-substrate temperature during growth of $Ga_xIn_{(1-x)}N$, leading to higher growth rates, improved $Ga_xIn_{(1-x)}N$ film quality, and more optimal doping levels.

EXAMPLE 6

The apparatus and method according to the invention has also been used for the low-temperature growth (500° C.) of GaAs epitaxial layers. In conventional MOCVD of GaAs, the growth rate drops off significantly below ~600° C. most likely due to the reduced decomposition of $AsH_3$. Single-crystalline GaAs films were grown on single-crystal GaAs substrates at substrate temperatures of approximately 500° C. and precursor cracking temperatures of 650° C. using the above susceptor-quartz separator arrangement of the invention. Typical properties of such low-temperature-grown films are excellent (electron mobility ~2000 $cm^2$/Vsec at n ~6E17 $cm^3$), with little estimated compensation from carbon acceptors, and growth rate comparable to conventional, MOCVD-grown GaAs films at 650° C. Such low growth temperatures of GaAs-and-related materials are desirable for many device applications.

EXAMPLE 7

The apparatus and method according to the invention was also used to grow high-quality polycrystalline Si layers on glass at substrate temperatures of 650–700° C. but $SiH_4$-cracking temperatures of 800° C. Such high-quality poly-Si layers are of interest for flat-panel displays. The carrier mobility in the grown films are much improved compared to conventional grown poly-Si films.

The carrier mobility in the grown films, using the method according to the invention, as well as the use of a buffer layer, such as $CaF_2$, between the polycrystalline Si and glass, approaches that of the best laser recrystallized polycrystalline Si films. The invention saves the considerable effort and cost of laser recrystallization. Also, lowering the temperature further, i.e. more than 150° C., will allow lower cost glass substrates to be used.

The present invention is applicable to the growth of a wide variety of materials, and not just the electronic materials described in the above examples. The invention made be applied to any material that requires different substrate and cracking/pyrolysis/dissolution temperatures during growth. The invention may also be applied to materials that are only stable at lower temperatures, i.e., materials that are thermally unstable at high temperatures or precursor cracking temperatures. The invention is also advantageous in a number of other applications.

For example, in the present invention, it is possible to reduce the surface mobility of ad-atoms on the surface of the substrate, which is important for the growth of lattice-mismatched materials (like GaAs-on-Si) where strain-effects in combination with increased surface mobility can cause 3-dimensional nucleation at higher substrate temperatures. The present invention is also advantageous in the growth of certain unique device structures such as tunnel-interconnect, AlGaAs/GaAs or GaInP/GaAs cascade solar cells to obtain higher doping levels and higher conductance in the tunnel-junction layers.

The present invention may also be used in other growth situations where low-substrate temperatures are required, as in growth of HgCdTe, for obtaining improved epitaxial layers and device structures.

Some materials, such as $Si_3N_4$, are plasma deposited at reduced substrate temperatures. The present invention may be used to deposit such materials and avoid the damage that occurs due to the use of a plasma. In the case of $Si_3N_4$, silane and $NH_3$, which are broken down by the plasma, are instead thermally cracked while maintaining a lower substrate temperature.

Polymer films, which typically require lower deposition temperatures, may also be deposited according to the invention. These films are used for LED displays. For such applications, molecular beam epitaxy is being considered. The method according to the invention would be a lower cost, manufacturable and simpler deposition technique for these films.

The present invention can also be of benefit to the growth of material systems, such as InAsBiSb, where to incorporate a few percent of Bi into the layer, the growth temperature needs to lowered which in turn requires the use of more exotic precursors for Sb or leads to poor growth efficiencies using conventional precursors. This is also true for the MOCVD growth of materials like GaInAsSb, where the low temperature growth is required to incorporate Sb but high temperatures are required for sufficient cracking of $AsH_3$ to incorporate As.

In addition to these above advantages, the apparatus and method according to the invention minimizes the problem of any out-diffusion of impurities (adsorbed contaminants) from a typically porous graphite-susceptor, from the regions directly behind the substrate (in conventional susceptors the substrates directly contact the susceptor). Typically $O_2$, $H_2O$, and CO species are adsorbed inside the porous susceptor and can slowly and continually leach behind the substrate, causing residual contamination to persist throughout most of the epitaxial layers. In contrast, in the apparatus and method according to the invention, the substrate is in contact with a non-porous material, such as quartz. Note that the front-end of the susceptor, used for cracking, is not blocked by the substrate or other surfaces leading to a more rapid desorption of these contaminants as well as possible gettering in the so-called "buffer" layers of an epitaxial device. This can be of some importance in obtaining higher-purity, and possibly higher-lifetime epitaxial materials such as AlGaAs, through reduced $O_2$, $H_2O$, and CO-related contamination.

The present invention is equally applicable to etching a variety of materials. In a second embodiment of the method according to the invention, substrates are etched while being maintained a lower temperature than a cracking temperature for the etchant gases. Referring to FIGS. 1A and 1B, the etchant gases flow over the front end of susceptor 10 to produce the desired gas species. The species then flow over substrates 12 mounted on separators 11 and perform the desired etching, for example, trench etching.

In many prior art etching processes, the substrates are cooled to reduce their temperature. This typically requires special deposition and cooling equipment and increases the complexity of chamber design. The present invention can minimize these requirements through the use of the separators 11 that can control the substrate temperature to a desired level while maintaining the necessary temperatures to produce the thermally cracked etchant species.

Obviously, numerous modifications and variations of the present invention are possible in light of the above teachings. It is therefore to be understood that within the scope of the appended claims, the invention may be practiced otherwise than as specifically described herein.

What is claimed is:

1. A processing apparatus, comprising:
   a susceptor; and
   at least one separator mounted on said susceptor made of an optically transmissive material for optically coupling energy from said susceptor for heating a substrate to be mounted on said separator.

2. An apparatus as recited in claim 1, comprising:
said separator made of a material transmissive to black body radiation.

3. An apparatus as recited in claim 1, comprising:
said material having a low thermal conductivity.

4. An apparatus as recited in claim 1, comprising:
said material being quartz.

5. An apparatus as recited in claim 1, comprising:
a plurality of separators mounted on said susceptor made of an optically transmissive material, at least one of said separators having optical transmitting and thermal insulative properties different from those of another separator.

6. An apparatus as recited in claim 1, comprising:
said separator having a reflective coating.

7. An apparatus as recited in claim 6, comprising:
said reflective coating being one of a single and multiple layer dielectric reflective coating.

8. An apparatus as recited in claim 1, wherein said separator comprises:
a main portion having a first thickness; and
a ramp portion having a second thickness that decreases from said first thickness in a direction opposite to a gas flow direction of said apparatus.

9. An apparatus as recited in claim 1, comprising:
a susceptor having two heating zones.

10. An processing apparatus, comprising:
a susceptor having first and second portions;
a separator mounted on said second portion; and
wherein said first portion is at a first temperature and said separator allows a substrate mounted on said separator to be at a second temperature a predetermined number of degrees lower than said first temperature.

11. An apparatus as recited in claim 10, comprising:
said second temperature being determined by optical coupling to said susceptor.

12. An apparatus as recited in claim 11, comprising:
said second temperature being determined by optical coupling of black body radiation emitted by said susceptor.

13. An apparatus as recited in claim 11, comprising:
said second temperature being determined by at least one of optical transmission and thermal conductivity properties of said separator.

14. An apparatus as recited in claim 10, comprising:
said separator having a reflective coating.

15. An apparatus as recited in claim 10, comprising:
said separator having a one of a single and multiple layer dielectric reflective coating.

16. An apparatus as recited in claim 10, comprising:
said second temperature being at least approximately 100° C. lower than said first temperature.

17. An apparatus as recited in claim 16, comprising:
said first temperature being a cracking temperature.

18. An apparatus as recited in claim 10, comprising:
said first and second portions of saisd susceptor being separately heated.

19. A processing method, comprising:
heating a susceptor to a first temperature;
heating a substrate mounted on said susceptor using optical coupling to a second temperature lower than said first temperature; and
performing one of a growth and an etching operation on said substrate.

20. A processing method as recited in claim 19, comprising:
said second temperature being at least approximately 100° C. lower than said first temperature.

21. A processing method as recited in claim 19, comprising:
said first temperature being a precursor cracking temperature.

22. A processing method as recited in claim 19, comprising:
mounting said substrate on said susceptor using a separator; and
adjusting at least one an optical transmission property and a thermal conductivity property of said separator to determine said second temperature.

23. A processing method as recited in claim 22, wherein adjusting said optical transmission property comprises coating said separator with a reflective coating.

24. A processing method as recited in claim 22, wherein adjusting said optical transmission property comprises coating said separator with a one of a single and multiple layer dielectric reflective coating.

25. A processing method as recited in claim 19, comprising:
mounting said substrate on said susceptor using a separator; and
providing a ramp portion in said separator.

26. A processing method as recited in claim 19, wherein performing one of said growth and etching operation comprises growing substantially single-crystalline $Bi_2Te_3$.

27. A processing method as recited in claim 26, wherein:
heating said susceptor to said first temperature comprises heating to one of a Bi-containing and Te-containing precursor cracking temperature; and
heating said substrate to said second temperature comprises heating to a temperature to produce said substantially single-crystalline $Bi_2Te_3$.

28. A processing method as recited in claim 19, wherein performing one of said growth and etching operation comprises growing substantially single-crystalline $Sb_2Te_3$.

29. A processing method as recited in claim 28, wherein:
heating said susceptor to said first temperature comprises heating to one of a Sb-containing and Te-containing precursor cracking temperature; and
heating said substrate to said second temperature comprises heating to a temperature to produce said substantially single-crystalline $Sb_2Te_3$.

30. A processing method as recited in claim 19, wherein performing one of said growth and etching operation comprises growing a layered $Bi_2Te_3$-$Sb_2Te_3$ superlattice structure.

31. A processing method as recited in claim 19, wherein performing one of said growth and etching operation comprises growing GaN.

32. A processing method as recited in claim 31, wherein:
heating said susceptor to said first temperature comprises heating to a one of Ga-containing and N-containing precursor cracking temperature; and
heating said substrate to said second temperature comprises heating to a temperature approximately 150° C. lower than said first temperature.

33. A processing method as recited in claim 19, wherein performing one of said growth and etching operation comprises growing GaAs.

34. A processing method as recited in claim 19, wherein performing one of said growth and etching operation comprises growing polycrystalline Si.

35. A processing method as recited in claim 34, wherein:

heating said susceptor to said first temperature comprises heating to a Si-containing precursor cracking temperature; and heating said substrate to said second temperature comprises heating to a temperature at least approximately 100° C. lower than said first temperature.

36. A processing method as recited in claim 34, wherein:

heating said susceptor to said first temperature comprises heating $SiH_4$ to approximately 800° C.; and heating said substrate to said second temperature comprises heating to a temperature at least approximately 100–250° C. lower than said first temperature.

37. A processing method as recited in claim 34, comprising:

growing said polycrystalline Si on a glass substrate having a buffer layer disposed thereon.

38. A processing method as recited in claim 34, comprising:

growing said polycrystalline Si on a glass substrate having a $CaF_2$ buffer layer disposed thereon.

39. A processing method as recited in claim 19, wherein performing one of said growth and etching operation comprises growing a material thermally unstable at said first temperature.

40. A processing method as recited in claim 19, wherein performing one of said growth and etching operation comprises performing one of chemical vapor deposition, metallorganic chemical vapor deposition and organometallic vapor phase epitaxy.

41. A method as recited in claim 19, wherein performing one of said growth and etching operation comprises growing one of GaAs on a Si substrate, GaInN, HgCdTe, GaInAsSb and GaAsBiSb.

42. A method as recited in claim 19, wherein said performing step comprises:

growing highly smooth single crystalline, polycrystalline or amorphous films of low dielectric constant organic materials for electronic applications.

43. A method as recited in claim 19, wherein said performing step comprises:

growing highly smooth calcogenide materials for phase change applications.

44. A method as recited in claim 43, comprising growing $Sb_2Se_3$.

45. A method of growing substantially single crystalline $Bi_2Te$, on a substrate, comprising:

mounting the substrate on a separator supported on a susceptor maintained at a first predetermined temperature;

exposing Bi-containing and Te-containing precursors to the susceptor maintained at said first predetermined temperature so as to heat the Bi-containing and Te-containing precursors to their cracking temperatures to crack the Bi-containing and Te-containing precursors; and passing the cracked Bi-containing and Te-containing precursors to said substrate and growing substantially single crystalline $Bi_2Te_3$ on said substrate with the substrate maintained at a second predetermined temperature lower than said first predetermined temperature by the presence of the separator.

46. A method as recited in claim 45, comprising:

growing substantially single crystalline $Sb_2Te_2$ layered with said $Bi_2Te_3$ to form a superlattice structure.

47. A method of growing substantially single crystalline $Sb_2Te_3$ on a substrate, comprising:

mounting the substrate on a separator supported on a susceptor maintained at a first predetermined temperature;

exposing Sb-containing and Te-containing precursors to the susceptor maintained at said first predetermined temperature so as to heat the Sb-containing and Te-containing precursors to their cracking temperatures to crack the Sb-containing and Te-containing precursors; and passing the cracked Sb-containing and Te-containing precursors to said substrate and growing substantially single crystalline $Sb_2Te_3$ on said substrate with the substrate maintained at a second predetermined temperature lower than said first predetermined temperature by the presence of the separator.

48. A method of reducing contamination in materials, comprising:

mounting a nonporous separator on a susceptor;

placing a substrate on said separator during one of a growth and etching operation; and heating said substrate by optically coupling energy through said separator.

49. A processing apparatus, comprising:

a susceptor; and a plurality of separators mounted on said susceptor made of an optically transmissive material, at least one of said separators having optical transmitting and thermal insulative properties different from those of another separator.

50. An processing apparatus, comprising:

a susceptor; and at least one separator mounted on said susceptor made of an optically transmissive material, said separator having a reflective coating.

* * * * *

UNITED STATES PATENT AND TRADEMARK OFFICE
CERTIFICATE OF CORRECTION

PATENT NO.     : 6,071,351
DATED          : June 6, 2000
INVENTOR(S)    : Rama Venkatasubramanian It is certified that error appears in the above-identified patent and that said Letters Patent is hereby corrected as shown below:

<u>Column 1,</u>
Line 8, insert the following:

-- This invention was made with Government support and under Contract N00014-94-C-0088 awarded by the Office of Naval Research. The Government has certain rights in the invention. --

Signed and Sealed this

Sixteenth Day of September, 2003

JAMES E. ROGAN
*Director of the United States Patent and Trademark Office*